United States Patent
Lee et al.

(10) Patent No.: US 9,515,052 B1
(45) Date of Patent: Dec. 6, 2016

(54) SEMICONDUCTOR PACKAGE INCLUDING A STEP TYPE SUBSTRATE

(71) Applicant: SK hynix Inc., Icheon-si Gyeonggi-do (KR)

(72) Inventors: Kyu Won Lee, Seoul (KR); Ki Ill Moon, Seoul (KR); Cheol Woo Han, Cheongju-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/882,557

(22) Filed: Oct. 14, 2015

(30) Foreign Application Priority Data

Jun. 26, 2015 (KR) .................. 10-2015-0090940

(51) Int. Cl.
*H01L 23/02* (2006.01)
*H01L 25/065* (2006.01)

(52) U.S. Cl.
CPC ... *H01L 25/0657* (2013.01); *H01L 2225/0651* (2013.01); *H01L 2225/06513* (2013.01); *H01L 2225/06586* (2013.01)

(58) Field of Classification Search
CPC .................. H01L 25/0657; H01L 2924/15153
USPC ........................................ 257/686, 784, 780
See application file for complete search history.

(56) References Cited

U.S. PATENT DOCUMENTS

| | | | | |
|---|---|---|---|---|
| 5,600,541 A * | 2/1997 | Bone | ..................... | H01L 23/433 257/686 |
| 5,646,828 A * | 7/1997 | Degani | ................... | H01L 23/13 257/707 |
| 5,760,478 A * | 6/1998 | Bozso | ..................... | H01L 24/73 257/685 |
| 5,808,878 A * | 9/1998 | Saito | ..................... | H01L 23/552 257/659 |
| 6,294,406 B1 * | 9/2001 | Bertin | ................. | H01L 25/0657 257/777 |
| 6,659,512 B1 * | 12/2003 | Harper | ................ | H01L 25/0657 257/777 |
| 7,786,591 B2 * | 8/2010 | Khan | ..................... | H01L 23/13 257/668 |
| 2003/0148554 A1 * | 8/2003 | Gerber | ................ | H01L 23/4334 438/122 |
| 2004/0164390 A1 * | 8/2004 | Wang | ..................... | H01L 23/13 257/686 |
| 2006/0145339 A1 * | 7/2006 | Yang | ..................... | H01L 23/13 257/724 |
| 2006/0175696 A1 * | 8/2006 | Kim | ........................ | H01L 23/13 257/686 |
| 2008/0042265 A1 * | 2/2008 | Merilo | .................... | H01L 24/49 257/723 |
| 2008/0111224 A1 | 5/2008 | Byun et al. | | |
| 2008/0182364 A1 * | 7/2008 | Zhang | ................. | H01L 23/3128 438/122 |

* cited by examiner

*Primary Examiner* — Nitin Parekh
(74) *Attorney, Agent, or Firm* — William Park & Associates Ltd.

(57) ABSTRACT

Disclosed herein are semiconductor packages. A semiconductor package may include a substrate configured to include a first face and a second face opposite the first face and to have a recess formed in the first face. The semiconductor package may include a first semiconductor chip disposed on the bottom of the recess. The semiconductor package may include a second semiconductor chip disposed on the second face of the substrate. The semiconductor package may include a third semiconductor chip disposed over the first face of the substrate and the first semiconductor chip. The semiconductor package may include a fourth semiconductor chip disposed over the third semiconductor chip.

20 Claims, 8 Drawing Sheets

SEMICONDUCTOR PACKAGE INCLUDING A STEP TYPE SUBSTRATE

CROSS-REFERENCE TO RELATED APPLICATION

The present application claims priority under 35 U.S.C. §119(a) to Korean Patent Application No. 10-2015-0090940 filed on Jun. 26, 2015, in the Korean Intellectual Property Office, which is incorporated herein by reference in its entirety.

BACKGROUND

1. Technical Field

Various embodiments generally relate to a semiconductor package, and more particularly, to a semiconductor package including a step type substrate.

2. Related Art

As electronic products are reduced in size and have higher functionality, semiconductor chips having higher capacities have been required to satisfy certain functions. Furthermore, there has been a need to mount a larger number of semiconductor chips on an electronic product having a smaller size.

However, technologies in which a semiconductor chip having a high capacity is manufactured or a larger number of semiconductor chips are disposed in a limited space have reached their limits. Thus, recently, a larger number of semiconductor chips are now being embedded in a single package.

To this end, various technologies have been developed in which one or more semiconductor chips are embedded and electrical properties are improved without increasing a total thickness of a package.

SUMMARY

In an embodiment, a semiconductor package may be provided. The semiconductor package may include a substrate configured to include a first face and a second face opposite the first face and to have a recess formed in the first face. The semiconductor package may include a first semiconductor chip disposed to the bottom of the recess, and a second semiconductor chip disposed to the second face of the substrate. The semiconductor package may include a third semiconductor chip disposed over the first face of the substrate and the first semiconductor chip. The semiconductor package may include a fourth semiconductor chip disposed over the third semiconductor chip.

In an embodiment, an electronic system may be provided. The electronic system to which a semiconductor package has been applied may include a controller, an interface, an input/output device, and a memory device coupled by a bus. The controller and the memory device may include a semiconductor package, including a substrate configured to include a first face and a second face opposite the first face and to have a recess formed in the first face, a first semiconductor chip disposed to the bottom of the recess, a second semiconductor chip disposed to the second face of the substrate, a third semiconductor chip disposed over the first face of the substrate and the first semiconductor chip, and a fourth semiconductor chip disposed over the third semiconductor chip.

In an embodiment, a memory card may be provided. The memory card may include a semiconductor package. The memory card may include memory including a semiconductor package and a memory controller to control the memory. The semiconductor package may include a substrate configured to include a first face and a second face opposite the first face and to have a recess formed in the first face, a first semiconductor chip disposed to the bottom of the recess, a second semiconductor chip disposed to the second face of the substrate, a third semiconductor chip disposed over the first face of the substrate and the first semiconductor chip, and a fourth semiconductor chip disposed over the third semiconductor chip.

DETAILED DESCRIPTION

Hereinafter, a semiconductor package including a step type substrate may be described below with reference to the accompanying drawings through various examples of embodiments.

Various embodiments may provide a semiconductor package including a step type substrate.

Figure 1:
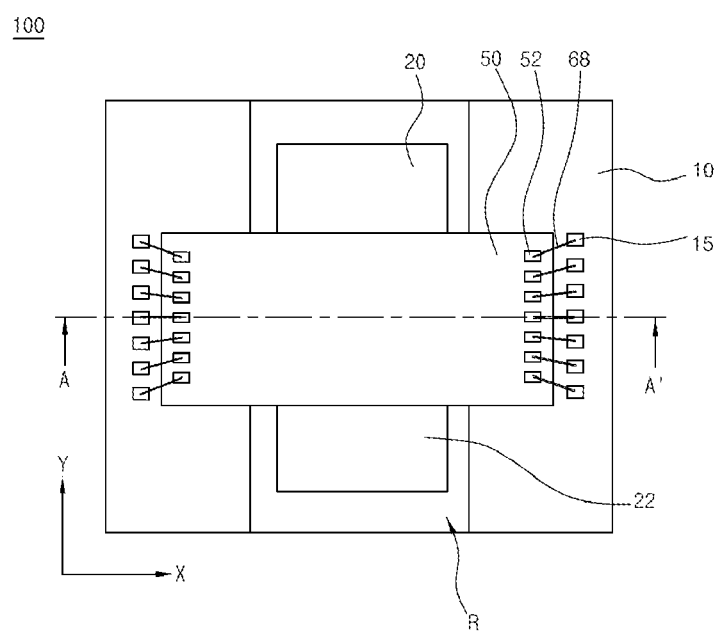
FIG. 1 is a plan view illustrating a representation of an example of a semiconductor package according to an embodiment other than a sealing member.
Figure 2:
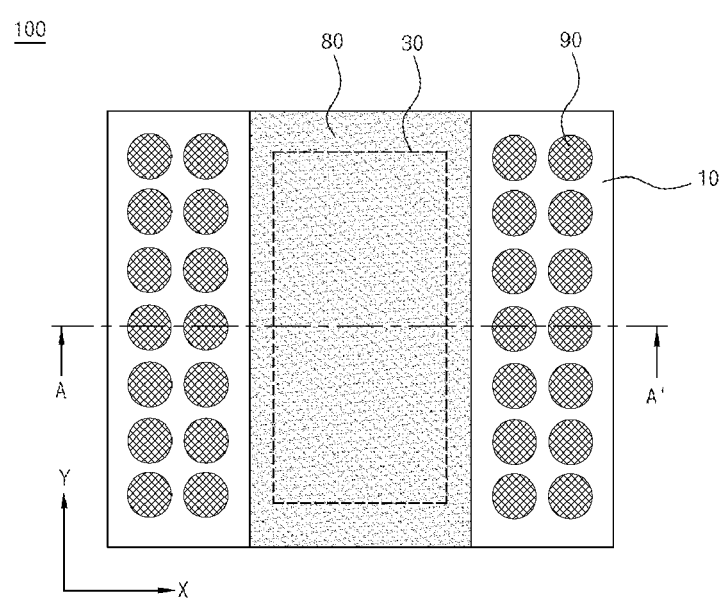
FIG. 2 is a bottom view illustrating a representation of an example of the semiconductor package according to an embodiment.
Figure 3:
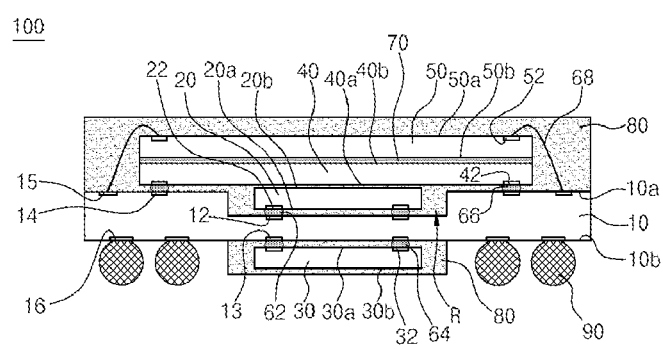
FIG. 3 is a cross-sectional view illustrating a representation of an example of the semiconductor package taken along line A-A' of FIG. 1 according to an embodiment.

Referring to FIGS. 1 to 3, a semiconductor package 100 according to an embodiment may include a substrate 10, semiconductor chips 20, 30, 40, and 50, first to third bumps 62, 64, and 66, bonding wires 68, a sealing member 80, and external connection electrodes 90. The semiconductor package 100 according to an embodiment may include an adhesive member 70.

The substrate 10 may be a printed circuit substrate of a multi-layer structure, for example. The substrate 10 may generally have a square plate shape when viewed on a plane. The substrate 10 may have a first face 10a corresponding to the top and a second face 10b facing the first face 10a and corresponding to the bottom. The substrate 10 may have a recess R in the first face 10a thereof so that it has a step type in terms of a cross section. When viewed on a plane, the recess R may have a rectangular shape in which a length in a first direction X is shorter than a length in a second direction Y perpendicular to the first direction X. The recess R may be formed in the central part of the first face 10a of the substrate 10 in such a way as to extend in the second direction Y. In an embodiment, the first direction may be an X direction, and the second direction may be a Y direction.

The substrate 10 may include a plurality of first bonding fingers 12 arranged at the bottom of the recess R, a plurality of third and fourth bonding fingers 14 and 15 arranged in the first face 10a, and second bonding fingers 13 arranged in the second face 10b. The substrate 10 may include a plurality of ball lands 16 arranged in the second face 10b. In an embodiment, the first bonding fingers 12 may be formed so that they are arranged in the second direction Y at edges that belong to the bottom of the recess R and that are placed on both sides in the first direction X. The second bonding fingers 13 may be formed so that they are arranged in portions of the second face 10b of the substrate 10 that faces the first bonding fingers 12. The third bonding fingers 14 may be formed so that they are arranged in the second direction Y in portions of the first face 10a of the substrate 10 adjacent to the recess R in the first direction X. The fourth bonding fingers 15 may be formed so that they are arranged in the second direction Y outside the third bonding fingers 14 in the first face 10a of the substrate 10. The ball lands 16 may be arranged in plural columns outside the second bonding fingers 13 in the second face 10b of the substrate 10, for example, in two columns at respective edges on both sides of the second face 10b of the substrate 10 in the first direction X.

Although not illustrated, the substrate 10 may include circuit patterns respectively formed in the first face 10a and the second face 10b including the recess R and via patterns formed on the inner surfaces of the circuit patterns. The first to fourth bonding fingers 12, 13, 14, and 15 may be end parts of the circuit patterns. The first to fourth bonding fingers 12, 13, 14, and 15 and the ball lands 16 may be electrically coupled by the circuit patterns and the via patterns. The substrate 10 may include solder resists formed on the first face 10a and the second face 10b and formed to cover the respective circuit patterns, but to expose the first to fourth bonding fingers 12, 13, 14, and 15 and the ball lands 16.

The first semiconductor chip 20 may include an active face 20a and a back side 20b opposite the active face 20a. In an embodiment, four or more sides may be provided between the active face 20a and the back side 20b. The first semiconductor chip 20 may include a plurality of first bonding pads 22 arranged in the second direction Y at edges on both sides in the first direction X of the active face 20a. In an embodiment, the first bonding pads 22 of the active face 20a may be arranged in the second direction Y at an edge and at another edge opposing the edge. The first semiconductor chip 20 may be disposed so that the active face 20a faces the bottom of the recess R. The first semiconductor chip 20 may be dispose to flip-chip bonding through the medium of the first bumps 62 formed on the first bonding pads 22 so that the first bonding pads 22 are electrically coupled to the first bonding fingers 12.

In an embodiment, when viewed on a plane, the first semiconductor chip 20 may have a shape corresponding to the recess R, that is, a rectangular shape in which a length in the second direction Y is longer than that in the first direction X. The first semiconductor chip 20 may be a memory chip. For example, the semiconductor chip 20 may be a memory chip for a mobile.

The second semiconductor chip 30 may include an active face 30a and a back side 30b opposite the active face 30a. In an embodiment, four or more sides may be provided between the active face 30a and the back side 30b. The second semiconductor chip 30 may include a plurality of second bonding pads 32 arranged in the second direction Y at an edge on both sides in the first direction X of the active face 30a. In an embodiment, the second bonding pads 32 of the active face 30a may be arranged in the second direction Y at an edge and at another edge opposing the edge. The second semiconductor chip 30 may be disposed so that the active face 30a faces the second face 10b of the substrate 10. The second semiconductor chip 30 may be dispose to flip-chip bonding through the medium of the second bumps 64 formed on the second bonding pads 32 so that the second bonding pads 32 are electrically coupled to the second bonding fingers 13.

In an embodiment, the second semiconductor chip 30 may generally have the same shape and size as the first semiconductor chip 20. The second semiconductor chip 30 may be disposed in the second face 10b of the substrate 10. The second semiconductor chip 30 may be a memory chip like the first semiconductor chip 20. In an embodiment, the sides of the first semiconductor chip 20 may vertically align with the sides of the second semiconductor chip 30 to provide little or no overhang between the two chips as illustrated in FIGS. 1-3.

The third semiconductor chip 40 may include an active face 40a and a back side 40b opposite the active face 40a. In an embodiment, four or more sides may be provided between the active face 40a and the back side 40b. The third semiconductor chip 40 may include a plurality of third bonding pads 42 arranged in the second direction Y at edges on both sides in the first direction X of the active face 40a. In an embodiment, the third bonding pads 42 of the active face 40a may be arranged in the second direction Y at an edge and at another edge opposing the edge. The third semiconductor chip 40 may be disposed so that the active face 40a faces the first face 10a of the substrate 10 and the back side 20b of the first semiconductor chip 20. The third semiconductor chip 40 may be dispose to flip-chip bonding through the medium of the third bumps 66 formed on the third bonding pads 42 so that the third bonding pads 42 are electrically coupled to the third bonding fingers 14.

In an embodiment, when viewed on a plane, the third semiconductor chip 40 may have a rectangular shape in which a length in the first direction X is longer or much longer than that in the second direction Y. The third semiconductor chip 40 may be disposed so that it is perpendicular to the first semiconductor chip 20 or the recess R. The first semiconductor chip 20 is disposed in the recess R of the substrate 10, and the third semiconductor chip 40 is mounted on the first semiconductor chip 20 and the first face 10a of the substrate 10. In an embodiment, the first semiconductor chip 20 is disposed in the recess R of the substrate 10, and the third semiconductor chip is mounted on the first face 10a of the substrate and crosses over, passes over, or bridges over the first semiconductor chip 20 and recess R. The first directions X of the first semiconductor chip 20 and the third semiconductor chip 40 that are crossed and stacked have different lengths, but an overhang structure not formed because part of the third semiconductor chip 40 more protruded than a boundary surface in the first direction X of the first semiconductor chip 20 is directly supported by the substrate 10. The third semiconductor chip 40 may be a memory chip.

The fourth semiconductor chip 50 may include an active face 50a and a back side 50b opposite the active face 50a. In an embodiment, four or more sides may be provided between the active face 50a and the back side 50b. The fourth semiconductor chip 50 may include a plurality of fourth bonding pads 52 arranged in the second direction Y at edges on both sides in the first direction X of the active face 50a. In an embodiment, the fourth bonding pads 52 of the active face 50a may be arranged in the second direction Y at an edge and at another edge opposing the edge. The fourth semiconductor chip 50 may be disposed on the back side 40b of the third semiconductor chip 40 through the medium of an adhesive member 70 so that the back side 50b faces the back side 40b of the third semiconductor chip 40. The fourth bonding pads 42 of the fourth semiconductor chip 50 may be electrically coupled to the fourth bonding fingers 15 of the substrate 10 by the bonding wires 68. The loop of the bonding wires 68 may be controlled by taking into consideration a total thickness of the semiconductor package 100 according to an embodiment.

In an embodiment, the fourth semiconductor chip 50 may generally have the same size and shape as the third semiconductor chip 40. That is, when viewed on a plane, the fourth semiconductor chip 50 may have a rectangular shape in which a length in the first direction X is longer than that in the second direction Y and may be disposed so that it is perpendicular to the first semiconductor chip 20. The fourth semiconductor chip 50 may be a memory chip. In an embodiment, the sides of the third semiconductor chip 40 may vertically align with the sides of the fourth semiconductor chip 50 to provide little or no overhang between the two chips as illustrated in FIGS. 1-3.

The adhesive member 70 functions to attach the fourth semiconductor chip 50 on the back side 30b of the third semiconductor chip 40 and may include an adhesive tape or an adhesive paste. The thickness of the adhesive member 70 may be properly controlled by taking into consideration a total thickness of the semiconductor package 100 according to an embodiment.

The sealing member 80 may include an epoxy molding compound. The sealing member 80 may be formed on the first face 10a of the substrate 10 so that it covers the first semiconductor chip 20, the third semiconductor chip 40, the fourth semiconductor chip 50, and the bonding wires 68 and may also be formed on part of the second face 10b of the substrate 10 so that it covers the second semiconductor chip 30. In this example, the sealing member 80 formed on the first face 10a of the substrate 10 may be formed to fill the recess R in which the first semiconductor chip 20 has been disposed.

The external connection electrodes 90 may include solder balls and may be formed on the respective ball lands 16 arranged in the second face 10b of the substrate 10. For example, the external connection electrodes 90 including solder balls may be formed by attaching the solder balls in the state in which a flux has been dotted on the ball lands 16 of the substrate 10 and reflowing the attached solder balls.

In an embodiment, the height of the solder ball may be set as a range in which the second semiconductor chip 30 and the sealing member 80 surrounding the second semiconductor chip 30 do not generate interface when the semiconductor package according to an embodiment is mounted on an external circuit, that is, a system board. In other words, the solder ball may be formed to have a height that is equal to or greater than the thickness of the sealing member 80 formed on the second face 10b of the substrate 10.

The aforementioned semiconductor package according to an embodiment is implemented by performing flip-chip bonding on the first and the second semiconductor chips over and under the step type substrate and stacking the third and the fourth semiconductor chips over the step type substrate.

Accordingly, the semiconductor package according to an embodiment can suppress a phenomenon in which the package is bent in one direction due to an asymmetrical structure because the chips are crossed and stacked. Furthermore, the semiconductor package according to an embodiment may be very stable in structure because all the semiconductor chips are firmly supported by the substrate or other chips without an overhang structure. Furthermore, the semiconductor package according to an embodiment can implement a relatively thin package compared to a package in which four semiconductor chips are vertically stacked on a substrate of the same thickness, for example, because the first semiconductor chip is disposed in the recess of the substrate. Furthermore, the semiconductor package according to an embodiment can implement a thin package because the thickness of the substrate or the external connection terminal is reduced to a minimum and the thickness of the chip is designed to determine the thickness of the package.

The semiconductor package according to an embodiment may be fabricated through the following processes.

Figure 4A:
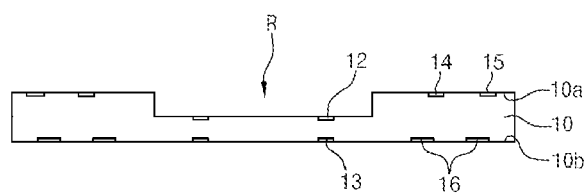
FIGS. 4A to 4F are cross-sectional views illustrating representations of examples for each process which illustrate a method of manufacturing a semiconductor package according to an embodiment.

Referring to FIG. 4A, the substrate 10 configured to include the first face 10a and the second face 10b opposite the first face 10a and to have the recess R formed in the central part of the first face 10a is prepared. As described above, when viewed on a plane, the recess R may have a shape in which a length in the second direction perpendicular to the first direction is much longer than a length in the first direction. The substrate 10 may include the plurality of first bonding fingers 12 arranged at the bottom of the recess R, the second bonding fingers 13 arranged in portions of the second face 10b of the substrate 10 corresponding to the first bonding fingers 12, the third bonding fingers 14 arranged in portions of the first face 10a adjacent to the recess R, and the fourth bonding fingers 15 arranged in portions of the first face 10a outside the third bonding fingers 14. The substrate 10 may include the ball lands 16 arranged in portions of the second face 10b outside the second bonding fingers 13.

Although not illustrated in FIG. 4A, the substrate 10 may include the circuit patterns respectively formed in the first face 10a and the second face 10b including the bottom of the recess R and the via patterns formed in the circuit patterns. Furthermore, the substrate 10 may include the solder resists formed to expose the second to fourth bonding fingers 13, 14, and 15 and the ball lands 16 on the first face 10a and the second face 10b, respectively.

Figure 4B:
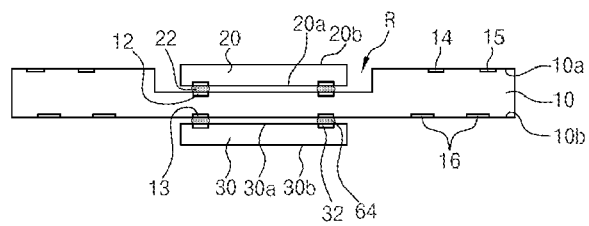

Referring to FIG. 4B, the first semiconductor chip 20 is disposed at the bottom of the recess R of the substrate 10 in accordance with a flip-chip bonding method. The first semiconductor chip 20 may have a shape similar to that of the recess R of the substrate 10, but may have a smaller size than the recess R when viewed on a plane. The first semiconductor chip 20 may include the first bonding pads 22 arranged at edges on both sides of the active face 20a. The first semiconductor chip 20 is physically attached within the recess R of the substrate 10 by the first bumps 62 respectively formed on the first bonding pads 22. The first bonding pads 22 of the first semiconductor chip 20 are electrically coupled to the first bonding fingers 12 of the substrate 10.

The second semiconductor chip 30 is disposed on the second face 10b of the substrate 10 in accordance with a flip-chip bonding method. The second semiconductor chip 30 may generally have the same shape as the first semiconductor chip 20. The second semiconductor chip 30 may include the second bonding pads 32 arranged at edges on both sides of the active face 30a. The second semiconductor chip 30 is physically attached to a portion of the second face 10b of the substrate 10 corresponding to the recess R by the second bumps 64 respectively formed on the second bonding pads 22. Furthermore, the second bonding pads 32 of the second semiconductor chip 30 are electrically coupled to the second bonding fingers 13 of the substrate 10.

Figure 4C:
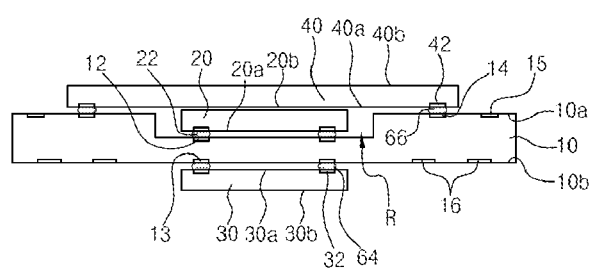

Referring to FIG. 4C, the third semiconductor chip 40 is disposed on the first semiconductor chip 20 and the first face 10a of the substrate 10 in accordance with a flip-chip bonding method. When viewed on a plane, the third semiconductor chip 40 may have a shape in which a length in the first direction is much greater than a length in the second direction perpendicular or substantially perpendicular to the first direction and may be disposed in such a way as to cross the first semiconductor chip 20. The third semiconductor chip 40 may include the third bonding pads 42 arranged at edges on both sides of the active face 40a of the third semiconductor chip 40. The third semiconductor chip 40 is physically attached to the first face 10a of the substrate 10 by the third bumps 66 respectively formed on the third bonding pads 42. Furthermore, the third bonding pads 42 of the third semiconductor chip 40 is electrically coupled to the third bonding fingers 14 of the substrate 10.

Figure 4D:
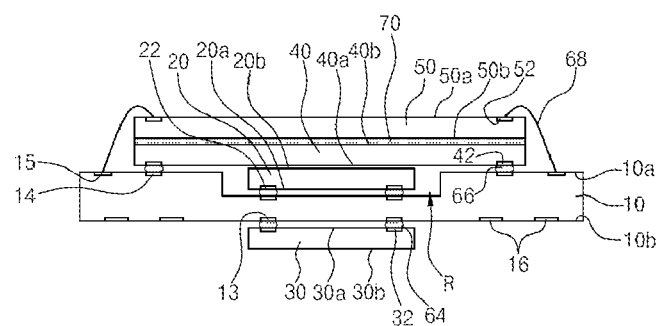

Referring to FIG. 4D, the fourth semiconductor chip 50 is disposed on the third semiconductor chip 40 in a space-up type. The fourth semiconductor chip 50 may generally have the same shape as the third semiconductor chip 40. The fourth semiconductor chip 50 may include the fourth bonding pads 52 arranged at edges on both sides of the active face 50a of the fourth semiconductor chip 50. The fourth semiconductor chip 50 is physically fixed on the third semiconductor chip 40 through the medium of the adhesive member 70. The fourth bonding pads 42 of the fourth semiconductor chip 50 and the fourth bonding fingers 15 of the substrate 10 are electrically coupled by the bonding wires 68.

Figure 4E:
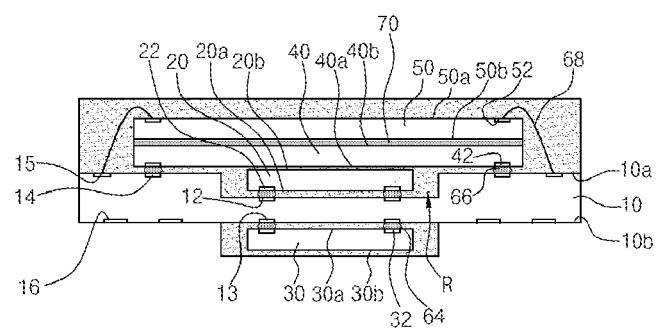

Referring to FIG. 4E, the sealing member 80 is formed on the entire first face 10a of the substrate 10 and on part of the second face 10b of the substrate 10 opposite the recess R through a molding process so that the first semiconductor chip 20, the third semiconductor chip 40, the fourth semiconductor chip 50, and the bonding wires 68 are covered and the second semiconductor chip 30 also covered. During the molding process, the materials of the sealing member 80 are filled in the recess R disposed in the first semiconductor chip 20. Furthermore, the materials are filled in the spaces between the substrate 10 and the first semiconductor chip 20 and the third semiconductor chip 40 and the space between the second face 10b of the substrate 10 and the second semiconductor chip 30.

Figure 4F:
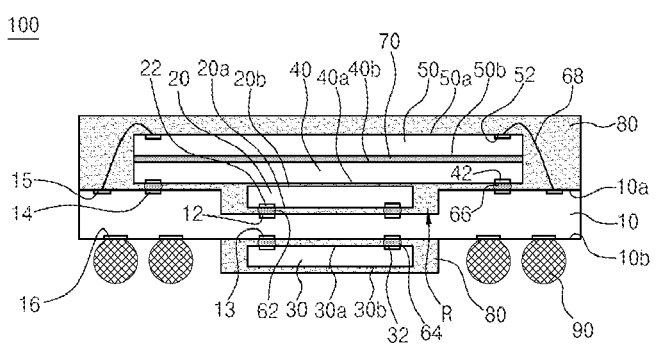

Referring to FIG. 4F, after a flux is dotted on the ball lands 16 arranged at the edges of the second face 10b of the substrate 10, the solder ball is attached on each of the ball land to which the flux has been dotted. Thereafter, a reflow process is performed on the attached solder balls, thereby forming the external connection electrodes 90 formed of the solder balls on the ball lands 16. As a result, the fabrication of the semiconductor package 100 according to an embodiment is completed.

Figure 5:
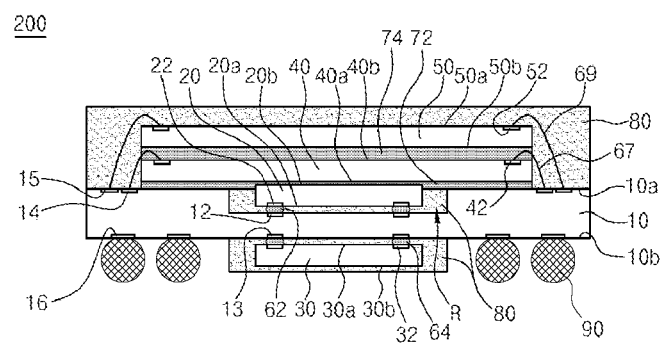
FIG. 5 is a cross-sectional view illustrating a representation of an example of a semiconductor package according to an embodiment.

Referring to FIG. 5, a semiconductor package 200 according to an embodiment may include a substrate 10, semiconductor chips 20, 30, 40, and 50, first and second bumps 62 and 64, first and second bonding wires 67 and 69, a sealing member 80, and external connection electrodes 90. The semiconductor package 200 according to an embodiment may further include first and second adhesive members 72 and 74.

The substrate 10 may include a first face 10a corresponding to the top and a second face 10b opposite the first face 10a and corresponding to the bottom. The substrate 10 may include a recess R in the first face 10a. The substrate 10 may include a plurality of first, third, and fourth bonding fingers 12, 14, and 15 arranged in the first face 10a and at the bottom of the recess R and second bonding fingers 13 arranged in the second face 10b of the substrate 10. The substrate 10 may include a plurality of ball lands 16 arranged in the second face 10b. In an embodiment, the third bonding fingers 14 may be placed outside a portion where the third semiconductor chip 40 is disposed in the first face 10a of the substrate 10.

Although not illustrated in FIG. 5, the substrate 10 may include circuit patterns respectively formed in the first face 10a and the second face 10b including the bottom of the recess R and via patterns formed within the circuit patterns. Furthermore, the substrate 10 may include a solder resist formed to expose the second to fourth bonding fingers 13, 14, and 15 and the ball lands 16 on the first face 10a and the second face 10b.

The first semiconductor chip 20 may include an active face 20a and a back side 20b opposite the active face 20a. The first semiconductor chip 20 may include a plurality of first bonding pads 22 arranged at edges on both sides of the active face 20a. The first semiconductor chip 20 may be dispose to flip-chip bonding to the bottom of the recess R through the medium of the first bump 62 formed on the first bonding pads 22.

The second semiconductor chip 30 may include an active face 30a and a back side 30b opposite the active face 30a. The second semiconductor chip 30 may include a plurality of second bonding pads 32 arranged at edges on both sides of the active face 30a. The second semiconductor chip 30 may be dispose to flip-chip bonding to the second face 10b of the substrate 10 through the medium of the second bumps 64 formed on the second bonding fingers 32.

The third semiconductor chip 40 may include an active face 40a and a back side 40b opposite the active face 40a. The third semiconductor chip 40 may include a plurality of third bonding pads 42 arranged at edges on both sides of the active face 40a. The third semiconductor chip 40 may be disposed so that the back side 40b faces the active face 20a of the first semiconductor chip 20 and the first face 10a of the substrate 10. The third semiconductor chip 40 may be disposed on the substrate 10 and the first semiconductor chip 20 through the medium of the first adhesive member 72 so that it crosses the first semiconductor chip 20.

The fourth semiconductor chip 50 may include an active face 50a and a back side 50b opposite the active face 50a. The fourth semiconductor chip 50 may include a plurality of fourth bonding pads 52 arranged at edges on both sides of the active face 40a. The fourth semiconductor chip 50 may be disposed on the third semiconductor chip 40 through the medium of the second adhesive member 74 so that the back side 50b faces the active face 40a of the third semiconductor chip 40. The fourth semiconductor chip 50 may generally have the same size and shape as the third semiconductor chip 40. The fourth semiconductor chip 50 may be disposed so that it is perpendicular or substantially perpendicular to the first semiconductor chip 20.

The first bumps 62 may electrically couple the first bonding fingers 12 of the substrate 10 and the first bonding pads 22 of the first semiconductor chip 20. The second bumps 64 may electrically couple the second bonding fingers 13 of the substrate 10 and the second bonding pads 32 of the second semiconductor chip 30. The first bonding wires 67 may electrically couple the third bonding fingers 14 of the substrate 10 and the third bonding pads 42 of the third semiconductor chip 40. The second bonding wires 69 may electrically couple the fourth bonding fingers 15 of the substrate 10 and the fourth bonding pads 52 of the fourth semiconductor chip 50.

The first and the second adhesive members 72 and 74 may include an adhesive tape or an adhesive paste. In particular, the second adhesive member 74 may have a sufficient thickness in which the wire loop of the first bonding wires 67 electrically coupling the third bonding fingers 14 of the substrate 10 and the third bonding pads 42 of the third semiconductor chip 40 is taken into consideration. For example, the second adhesive member 74 may be a penetrate wafer backside lamination (PWBL) film.

Although not illustrated in FIG. 5, the semiconductor package 200 according to an embodiment may include a spacer interposed between the third semiconductor chip 40 and the fourth semiconductor chip 50 in order to secure the wire loop of the first bonding wires 67.

The sealing member 80 may include an epoxy molding compound. The sealing member 80 may be formed on the first face 10a of the substrate 10 so that it covers the first, the third, and the fourth semiconductor chips 20, 40, and 50 and the first and the second bonding wires 67 and 69. Furthermore, the sealing member 80 may be formed on part of the second face 10b of the substrate 10 so that it covers or substantially covers the second semiconductor chip 30. Furthermore, the sealing member 80 may be formed to fill the recess R in which the first semiconductor chip 20 has been disposed.

The external connection electrodes 90 may include solder balls and may be formed on the ball lands 16 arranged in the second face 10b of the substrate 10.

The aforementioned semiconductor packages may be applied to a variety of types of semiconductor devices and package modules including the same.

Figure 6:
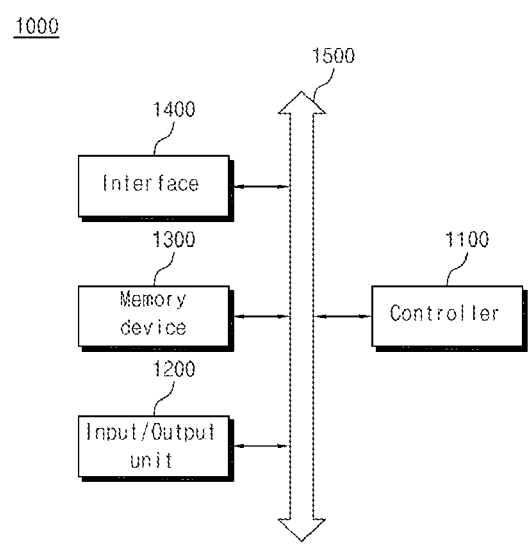
FIG. 6 is a block diagram illustrating a representation of an example of an electronic system to which a semiconductor package according to various embodiments has been applied.

FIG. 6 is a block diagram of an electronic system to which a semiconductor package according to various embodiments has been applied.

As illustrated in FIG. 6, the electronic system 1000 may include a controller 1100, an input/output device 1200, and a memory device 1300. The controller 1100, the input/output device 1200, and the memory device 1300 may be coupled through a bus 1500 providing a passage through which data moves.

For example, the controller 1100 may include at least one of at least one microprocessor, at least one digital signal processor, at least one microcontroller, and logic elements capable of performing a function similar to that of the microprocessor, digital signal processor, and microcontroller. The controller 1100 and the memory device 1300 may include the semiconductor package according to the various embodiments. The input/output device 1200 may include at least one of a keypad, a keyboard, and a display device.

The memory device 1300 may store data and/or instructions executed by the controller 1100. The memory device 1300 may include a volatile memory device, such as DRAM, and/or a nonvolatile memory device, such as flash memory. For example, flash memory may be mounted on a mobile device or an information processing system, such as a desktop computer. Such flash memory may include a semiconductor disk device (e.g., SSD). In this case, the electronic system 1000 may stably store a large amount of data in a flash memory system.

The electronic system 1000 may further include an interface 1400 for sending data to a communication network or receiving data from a communication network. The interface 1400 may have a wired/wireless form. For example, the interface 1400 may include an antenna or a wired/wireless transceiver.

Although not illustrated in FIG. 6, the electronic system 1000 may further include an application chip set, a camera image processor, and an input/output device.

The electronic system 1000 may be implemented as a mobile system, a personal computer, an industry computer, or a logic system performing various functions. For example, the mobile system may be any one of a person digital assistant (PDA), a portable computer, a web tablet, a mobile phone, a smart phone, a wireless phone, a laptop computer, a memory card, a digital music system digital, and an information transmission/reception system.

If the electronic system 1000 is equipment capable of performing wireless communication, the electronic system 1000 may be used in communication systems, such as code division multiple access (CDMA), global system for mobile communication (GSM), north American digital cellular (NADC), enhanced-time division multiple access (E-TDMA), wideband code division multiple access (WCDMA), CDMA2000, long term evolution (LTE), and Wibro wireless broadband Internet.

Figure 7:
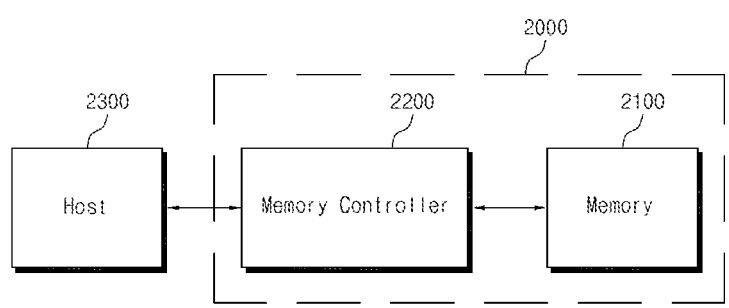
FIG. 7 is a block diagram illustrating a representation of an example of a memory card including a semiconductor package according to various embodiments.

FIG. 7 is a block diagram of a memory card including the semiconductor package according to the various embodiments. As illustrated in FIG. 7, the semiconductor package according to various embodiments may be provided in the form of the memory card 2000. For example, the memory card 2000 may include memory 2100, such as a nonvolatile memory device, and a memory controller 2200. The memory 2100 and the memory controller 2200 may store data or read stored data.

The memory 2100 may include at least one of nonvolatile memory devices to which the semiconductor package according to various embodiments has been applied. The memory controller 2200 may control the memory 2100 so that it reads stored data or stores data in response to a read/write request from the host 2300.

While various embodiments have been described above, it will be understood to those skilled in the art that the embodiments described are by way of example only. Accordingly, the semiconductor package described herein should not be limited based on the described embodiments.

What is claimed is:

1. A semiconductor package, comprising:
   a substrate having a first face and a second face opposite the first face, and having a recess formed in the first face;
   a first semiconductor chip disposed to a bottom of the recess;
   a second semiconductor chip disposed to the second face of the substrate;
   a third semiconductor chip disposed over the first face of the substrate and the first semiconductor chip;
   a fourth semiconductor chip disposed over the third semiconductor chip,
   wherein each of the first to fourth semiconductor chips comprises an active face and a back side opposite the active face, and the first to fourth semiconductor chips comprise first to fourth bonding pads arranged adjacently to an edge and another edge opposing the edge of each of the active faces,
   wherein the third semiconductor chip is disposed to the first face of the substrate through a plurality of flip chip bumps so that the active face of the third semiconductor chip faces the first face of the substrate and the back side of the first semiconductor chip, and
   wherein the fourth semiconductor chip is disposed over the back side of the third semiconductor chip so that the back side of the fourth semiconductor chip faces the
back side of the third semiconductor chip,
first to third bumps configured to electrically couple
between the substrate and the first to third semiconductor chips; and
a bonding wire configured to electrically couple the
substrate and the fourth semiconductor chip.

2. The semiconductor package of claim 1,
wherein the first semiconductor chip is disposed to the
bottom of the recess through a plurality of flip-chip
bumps, and
wherein the second semiconductor chip is disposed to the
second face of the substrate through a plurality of
flip-chip bumps.

3. The semiconductor package of claim 1, wherein the
substrate comprises:
first bonding fingers arranged in the bottom of the recess,
second bonding fingers arranged in the second face,
third bonding fingers arranged in portions of the first face
outside the recess, and
fourth bonding fingers arranged in portions of the first
face outside the third bonding fingers.

4. The semiconductor package of claim 3, wherein the
substrate further comprises ball lands arranged in portions of
the second face of the substrate outside the second bonding
fingers.

5. The semiconductor package of claim 4, further comprising external connection electrodes formed on the ball
lands arranged in the second face of the substrate.

6. The semiconductor package of claim 5,
wherein the external connection electrodes comprise solder balls, the solder ball having a height identical with
or greater than a thickness of a sealing member formed
on the second face of the substrate.

7. The semiconductor package of claim 1, wherein a
length of the recess in a second direction perpendicular to a
first direction is longer than a length of the recess in the first
direction.

8. The semiconductor package of claim 1, wherein each of
the first semiconductor chip and the second semiconductor
chip has a longer length in a second direction perpendicular
to a first direction than a length of the recess in the first
direction and generally have an identical size and shape to
each other.

9. The semiconductor package of claim 1, wherein each of
the third semiconductor chip and the fourth semiconductor
chip has a longer length in a first direction than a length in
a second direction perpendicular to the first direction and
generally have an identical size and shape to each other.

10. The semiconductor package of claim 1, further comprising an adhesive member interposed between the back
side of the third semiconductor chip and the back side of the
fourth semiconductor chip.

11. The semiconductor package of claim 1, further comprising a sealing member formed on the first face of the
substrate to substantially cover the first, the third, and the
fourth semiconductor chips and formed on the second face
of the substrate to substantially cover the second semiconductor chip.

12. The semiconductor package of claim 11, wherein the
sealing member is substantially formed on the first face of
the substrate and is only partially formed on the second face
of the substrate.

13. The semiconductor package of claim 12, wherein the
sealing member is formed to bury the recess in which the
first semiconductor chip has been disposed.

14. A semiconductor package, comprising:
a substrate having a first face and a second face opposite
the first face, and having a recess formed in the first
face;
a first semiconductor chip disposed to a bottom of the
recess;
a second semiconductor chip disposed to the second face
of the substrate;
a third semiconductor chip disposed over the first face of
the substrate and the first semiconductor chip; and
a fourth semiconductor chip disposed over the third
semiconductor chip,
wherein each of the first to fourth semiconductor chips
comprises an active face and a back side opposite the
active face, and the first to fourth semiconductor
chips comprise first to fourth bonding pads arranged
adjacently to an edge and another edge opposing the
edge of each of the active faces, and
wherein the third semiconductor chip is disposed over
the first face of the substrate so that the back side of
the third semiconductor chip faces the first face of
the substrate and the back side of the first semiconductor chip, and
wherein the fourth semiconductor chip is disposed over
the active face of the third semiconductor chip so
that the back side of the fourth semiconductor chip
faces the active face of the third semiconductor chip.

15. The semiconductor package of claim 14, further
comprising:
first and second bumps configured to electrically couple
the substrate and the first and the second semiconductor
chips; and
first and second bonding wires configured to electrically
couple the substrate and the third and the fourth semiconductor chips.

16. The semiconductor package of claim 14, further
comprising:
a first adhesive member interposed between the first face
of the substrate and the back side the first semiconductor chip and the back side of the third semiconductor
chip; and
a second adhesive member interposed between the active
face of the third semiconductor chip and the back side
of the fourth semiconductor chip.

17. The semiconductor package of claim 16, wherein the
second adhesive member comprises a penetrate wafer backside lamination (PWBL) film.

18. The semiconductor package of claim 14, wherein the
substrate comprises:
first bonding fingers arranged in the bottom of the recess,
second bonding fingers arranged in the second face,
third bonding fingers arranged in portions of the first face
outside the recess,
fourth bonding fingers arranged in portions of the first
face outside the third bonding fingers, and
ball lands arranged in portions of the second face of the
substrate outside the second bonding fingers.

19. The semiconductor package of claim 14,
wherein a length of the recess in a second direction
perpendicular to a first direction is longer than a length
of the recess in the first direction,
wherein each of the first semiconductor chip and the
second semiconductor chip has a longer length in a
second direction perpendicular to a first direction than
a length of the recess in the first direction and generally
have an identical size and shape to each other, and each of the third semiconductor chip and the fourth semiconductor chip has a longer length in a first direction than a length in a second direction perpendicular to the first direction and generally have an identical size and shape to each other.

20. The semiconductor package of claim 14, further comprising a sealing member formed on the first face of the substrate to substantially cover the first, the third, and the fourth semiconductor chips and formed on the second face of the substrate to substantially cover the second semiconductor chip.

* * * * *